(12) United States Patent
Eguchi et al.

(10) Patent No.: US 8,871,643 B2
(45) Date of Patent: Oct. 28, 2014

(54) LATERAL SEMICONDUCTOR DEVICE AND MANUFACTURING METHOD FOR THE SAME

(75) Inventors: Hiroomi Eguchi, Seto (JP); Takashi Okawa, Toyota (JP); Atsushi Onogi, Toyota (JP)

(73) Assignee: Toyota Jidosha Kabushiki Kaisha, Toyota (JP)

( * ) Notice: Subject to any disclaimer, the term of this patent is extended or adjusted under 35 U.S.C. 154(b) by 0 days.

(21) Appl. No.: 13/976,266

(22) PCT Filed: Feb. 8, 2011

(86) PCT No.: PCT/JP2011/000696
§ 371 (c)(1),
(2), (4) Date: Jun. 26, 2013

(87) PCT Pub. No.: WO2012/107954
PCT Pub. Date: Aug. 16, 2012

(65) Prior Publication Data
US 2013/0309867 A1 Nov. 21, 2013

(51) Int. Cl.
*H01L 21/302* (2006.01)
*H01L 29/66* (2006.01)
*H01L 29/423* (2006.01)
*H01L 29/739* (2006.01)
*H01L 21/306* (2006.01)

(52) U.S. Cl.
CPC ...... *H01L 29/6625* (2013.01); *H01L 29/66325* (2013.01); *H01L 29/4236* (2013.01); *H01L 29/7394* (2013.01); *H01L 21/30604* (2013.01)
USPC ........... 438/689; 438/225; 438/297; 438/439; 257/335; 257/347; 257/368; 257/370

(58) Field of Classification Search
USPC .......... 257/335, 347, 368, 370; 438/225, 297, 438/439, 689
See application file for complete search history.

(56) References Cited

U.S. PATENT DOCUMENTS 5,329,142 A   7/1994   Kitagawa et al.
7,476,942 B2 *   1/2009   Watanabe et al. ............. 257/370

FOREIGN PATENT DOCUMENTS

| JP | A-07-135309 | 5/1995 |
| JP | A-2004-214701 | 7/2004 |
| JP | 2009-1706671 | * 7/2009 |
| JP | A-2009-170671 | 7/2009 |
| JP | A-2010-251627 | 11/2010 |

* cited by examiner

*Primary Examiner* — Duy Deo
*Assistant Examiner* — Maki Angadi
(74) *Attorney, Agent, or Firm* — Oliff PLC

(57) ABSTRACT

A manufacturing method for manufacturing a lateral semiconductor device having an SOI (Silicon on Insulator) substrate, the lateral semiconductor device comprising a semiconductor layer that includes a buried oxide layer and a drift region, the manufacturing method comprising an etching process of etching, by a predetermined depth, a LOCOS oxide that projects from a surface of the semiconductor layer by a predetermined thickness and is embedded in the semiconductor layer by a predetermined thickness, and a trench forming process of simultaneously forming a first trench extending from the drift region toward the buried oxide layer, and a second trench extending from a portion obtained by the etching in the etching process toward the buried oxide layer, at a same etching rate, and stopping forming the first trench and the second trench at a time when the second trench reaches the buried oxide layer.

1 Claim, 9 Drawing Sheets (a)　　　　　　　　　　　(b)

(a)　　　　　　　　　　　(b)

F I G. 6
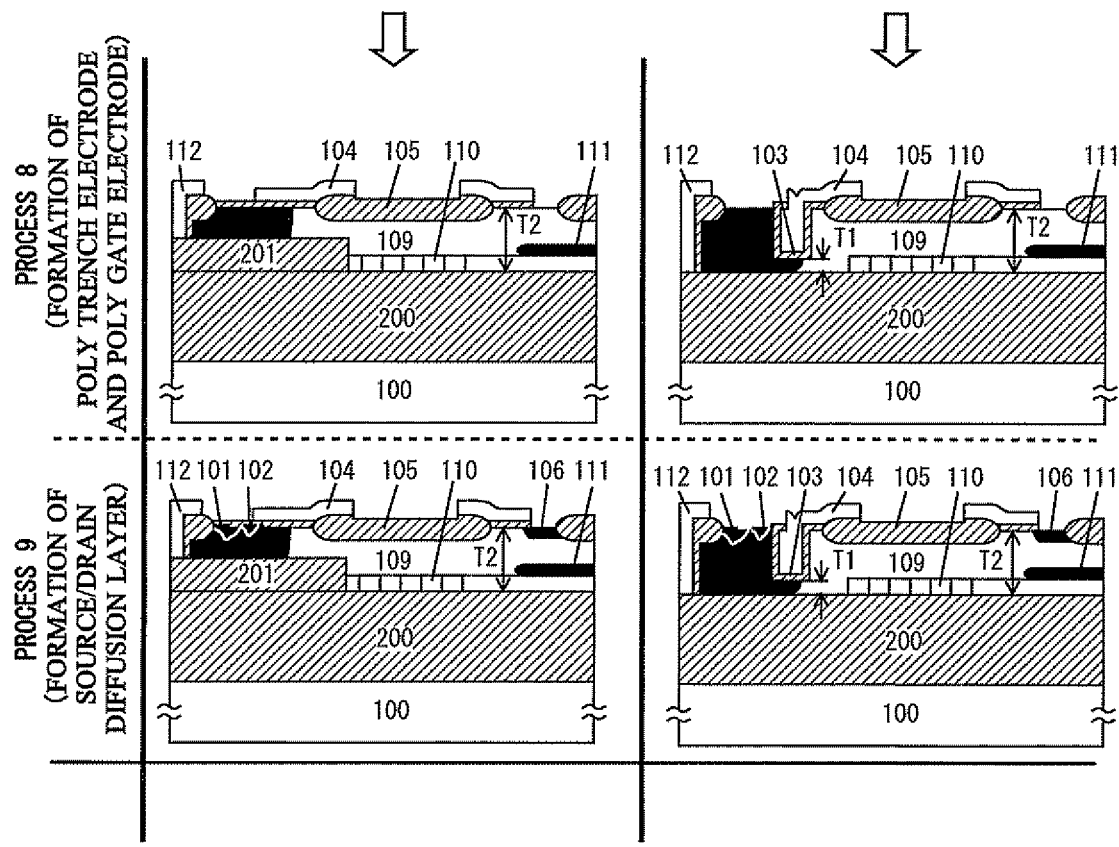

F I G. 7
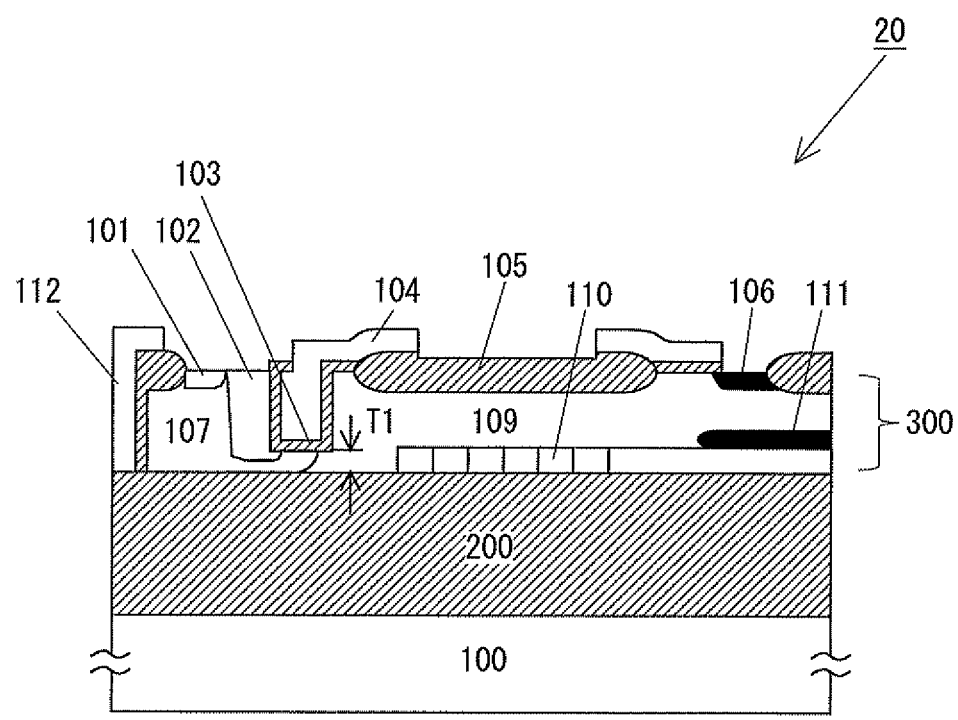

F I G. 9
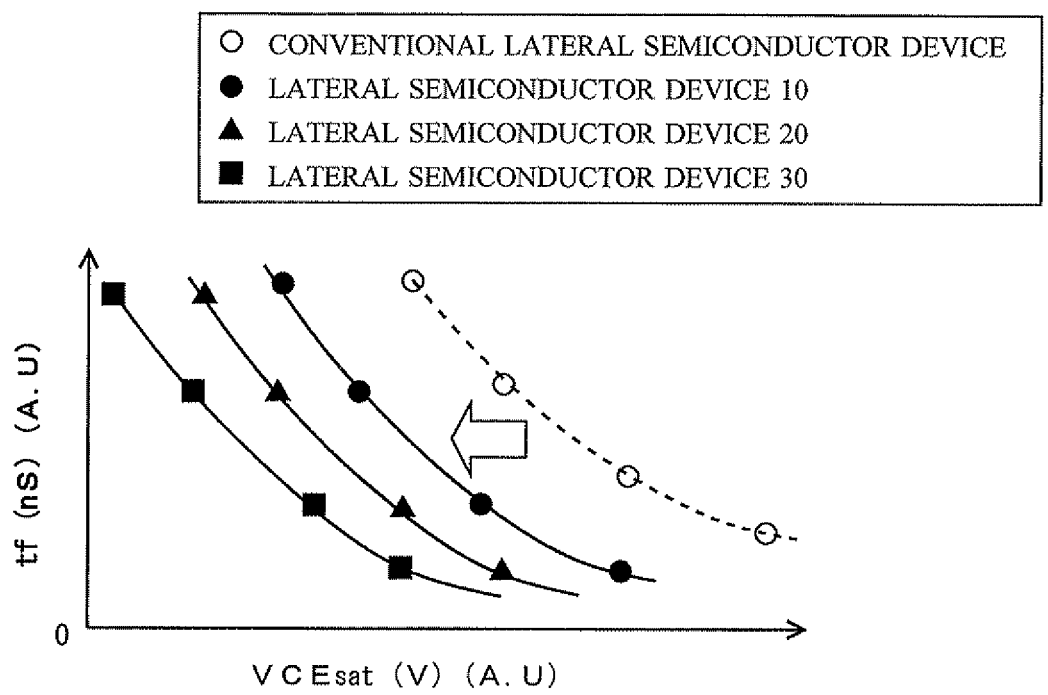

(a)

PRIOR ART

US 8,871,643 B2

1

LATERAL SEMICONDUCTOR DEVICE AND MANUFACTURING METHOD FOR THE SAME

TECHNICAL FIELD

The present invention relates to semiconductor devices, and more particularly to lateral IGBTs (Insulated Gate Bipolar Transistors) and a manufacturing method for the same.

BACKGROUND ART

To date, integrated circuits (also referred to as ICs) each of which has semiconductor devices such as a diode and a transistor, and driving control circuits for the semiconductor devices integrated on one silicon substrate, have been developed. In particular, a lateral insulated gate bipolar transistor (LIGBT, hereinafter, simply referred to as a lateral semiconductor device) is a power transistor that includes a MOS input structure, and a bipolar output structure, and is a semiconductor that has an advantage that high power driving can be derived from less power with its high voltage and current semiconductor properties.

The lateral semiconductor device has a characteristic that conductivity modulation is enhanced in a drift region in an on-state, thereby obtaining a low on-voltage (on-resistance). For example, a technique disclosed in Patent Literature 1 represents an example of the lateral semiconductor device.

CITATION LIST

Patent Literature

Patent Literature 1: Japanese Laid-Open Patent Publication No. 2010-251627

SUMMARY OF THE INVENTION

Problems to be Solved by the Invention

As shown in FIG. 10, in the lateral semiconductor device disclosed in Patent Literature 1, a buried oxide layer 200 disposed under a P-type body layer 107 among the P-type body layer 107 and N-type drift layers 109a and 109b has a thickness that is greater than a remaining region of the buried oxide layer 200 disposed under the N-type drift layers 109a and 109b. Thus, fewer holes drift through from the N-type drift layer region 109a to the P-type body layer 107 to reduce an on-resistance, as compared to the N-type drift layer region 109b.

In the description herein, the buried oxide layer 200 disposed under the P-type body layer 107 portion is particularly referred to as a carrier accumulation promoting BOX 201.

Although an on-resistance is reduced in the lateral semiconductor device disclosed in Patent Literature 1 in the method as described above, a problem arises that production cost is increased. Namely, as shown in FIG. 10, the carrier accumulation promoting BOX 201 is formed to partially increase a thickness of the buried oxide layer, thereby realizing reduction of an on-resistance.

However, in order to manufacture the lateral semiconductor device disclosed in Patent Literature 1, a process of forming the carrier accumulation promoting BOX 201 is performed in addition to processes for manufacturing a lateral semiconductor device that does not have the carrier accumulation promoting BOX 201.

2

The present invention is made in view of the aforementioned situation, and an object of the present invention is to make available a lateral semiconductor device with a lower on-resistance structure than taught in Patent Literature 1 while simplifying the manufacturing process, and a manufacturing method for the same.

Solution to the Problems

A first aspect of the present invention is directed to a lateral semiconductor device having an SOI (Silicon on Insulator) substrate. The lateral semiconductor device includes a semiconductor layer including a body region (107) on a buried oxide layer (200), and a drift region (109) that contacts with a side surface of the body region (107). Further, the lateral semiconductor device has a first trench that is recessed, toward the buried oxide layer (200), in an interface between the body region (107) and the drift region (109) so as not to reach the buried oxide layer (200).

In a second aspect of the present invention based on the first aspect, a value of a distance from a bottom of the first trench to the buried oxide layer (200) is less than a value of a thickness of the drift region (109) represented as a value of a distance from a surface of the buried oxide layer (200) to a surface of the drift region (109).

In a third aspect of the present invention based on the second aspect, an emitter region (102) that does not reach the buried oxide layer (200) is fowled in the body region (107) so as to contact with a side surface of the first trench. Further, a distance from the surface of the buried oxide layer (200) to the emitter region (102) is less than a distance from the bottom of the first trench to the buried oxide layer (200).

In a fourth aspect of the present invention based on the second aspect, a carrier accumulation layer region (114) is formed in the drift region (109) so as to contact with the bottom of the first trench and the side surface of the body region (107). Further, a concentration of an impurity in the carrier accumulation layer region (114) is higher than a concentration of an impurity in the drift region (109).

In a fifth aspect of the present invention based on the first aspect, a second trench that passes through a LOCOS oxide (105) so as to reach the buried oxide layer (200) is further provided, and the LOCOS oxide (105) projects from a surface of the semiconductor layer by a predetermined thickness and is embedded in the semiconductor layer by a predetermined thickness. The first trench is recessed in the semiconductor layer so as to extend from a portion in which the LOCOS oxide (105) is not formed.

A sixth aspect of the present invention is directed to a manufacturing method for manufacturing a lateral semiconductor device having an SOI (Silicon on Insulator) substrate. The lateral semiconductor device includes a semiconductor layer that includes a buried oxide layer (200) and a drift region (109). The manufacturing method includes an etching process of etching, by a predetermined depth, a LOCOS oxide (105) that projects from a surface of the semiconductor layer by a predetermined thickness and is embedded in the semiconductor layer by a predetermined thickness, and a trench forming process of simultaneously forming a first trench extending from the drift region (109) toward the buried oxide layer (200), and a second trench extending from a portion obtained by the etching in the etching process toward the buried oxide layer (200), at a same etching rate, and stopping forming the first trench and the second trench at a time when the second trench reaches the buried oxide layer (200).

Advantageous Effects of the Invention

According to the first aspect, the lateral semiconductor device with a lower on-resistance structure than conventional lateral semiconductor devices while simplifying the manufacturing process, can be provided. Namely, in the conventional lateral semiconductor devices, a thickness of a buried oxide layer disposed under a P-type body layer is made greater than a thickness of a remaining region of the buried oxide layer 200 disposed under an N-type drift layer (carrier accumulation promoting BOX).

Thus, fewer holes drift through from the N-type drift layer region to the P-type body layer to reduce an on-resistance. On the other hand, in the lateral semiconductor device according to the present invention, a route through which holes transfer from the drift region 109 to the main body region 107 is narrowed by the trench gate, and holes are accumulated, thereby reducing an on-resistance. Namely, the lateral semiconductor device according to the present invention need not include the carrier accumulation promoting BOX. Therefore, since a cost for a process of forming the trench is lower than a cost for a process of forming the carrier accumulation promoting BOX, production cost can be reduced.

Further, in the lateral semiconductor device according to the present invention, a trench-type gate structure in which a trench does not reach the buried oxide layer 200 is formed in an interface between the main body region 107 and drift region 109. Therefore, the thickness of the drift region 109 can be extremely reduced, and storing of holes is enhanced near a region in which the thickness is reduced, as compared to in the conventional lateral semiconductor devices. Therefore, a resistance in the region can be also reduced greatly.

According to the second aspect, the value of the distance from the bottom of the trench to the buried oxide layer 200 is less than the value of the thickness of the drift region 109 represented as the value of the distance from the surface of the buried oxide layer 200 to the surface of the drift region 109, thereby reducing holes transferred to the main body region 107. Thus, electric charge is stored to enable reduction of a resistance.

According to the third aspect, electron current flowing into the drift region 109 can be increased, thereby enabling improvement of a trade-off characteristic.

According to the fourth aspect, the carrier accumulation layer region 114 in which a concentration of an impurity is high is fowled in the drift region 109. Therefore, holes are less likely to transfer from the drift region 109 to the main body region 107, and carrier storing effect is enhanced, to enable improvement of a trade-off characteristic.

According to the fifth aspect, the second trench passes through the LOCOS oxide 105 so as to reach the buried oxide layer, and the first trench is recessed in a region in which the LOCOS oxide 105 is not formed. Therefore, for example, a process cost for forming a trench for a gate electrode and a trench for a device-isolating electrode can be reduced. Namely, if, after the LOCOS oxide 105 is etched, etching for forming the first trench and etching for forming the second trench are simultaneously started so as to be performed at the same rate, when the second trench reaches the buried oxide layer, the first trench is formed. Thus, each of the trenches can be simultaneously formed in one process.

According to the sixth aspect, the same effect as that of the first aspect can be obtained, and further, for example, a trench for a gate electrode and a trench for a device-isolating electrode can be formed in one process, thereby reducing a process cost.

BRIEF DESCRIPTION OF THE DRAWINGS

FIG. 6 illustrates an exemplary manufacturing process (process 8 to process 9) for manufacturing the lateral semiconductor device 10 according to the first embodiment.

FIG. 7 is a cross-sectional view of an exemplary main portion of a structure of a lateral semiconductor device 20 according to a second embodiment.

FIG. 9 illustrates collector-emitter saturation voltage (VCEsat)—turn-off switching time (tf) characteristics in the lateral semiconductor devices according to the respective embodiments and a conventional lateral semiconductor device.

DESCRIPTION OF EMBODIMENTS

First Embodiment

Structure

Hereinafter, a lateral IGBT (Insulated Gate Bipolar Transistor, hereinafter, simply referred to as a lateral semiconductor device 10) according to a first embodiment of the present invention will be described with reference to the drawings.

Firstly, a structure of the lateral semiconductor device 10 according to the first embodiment of the present invention will be described with reference to the drawings.

Figure 1:
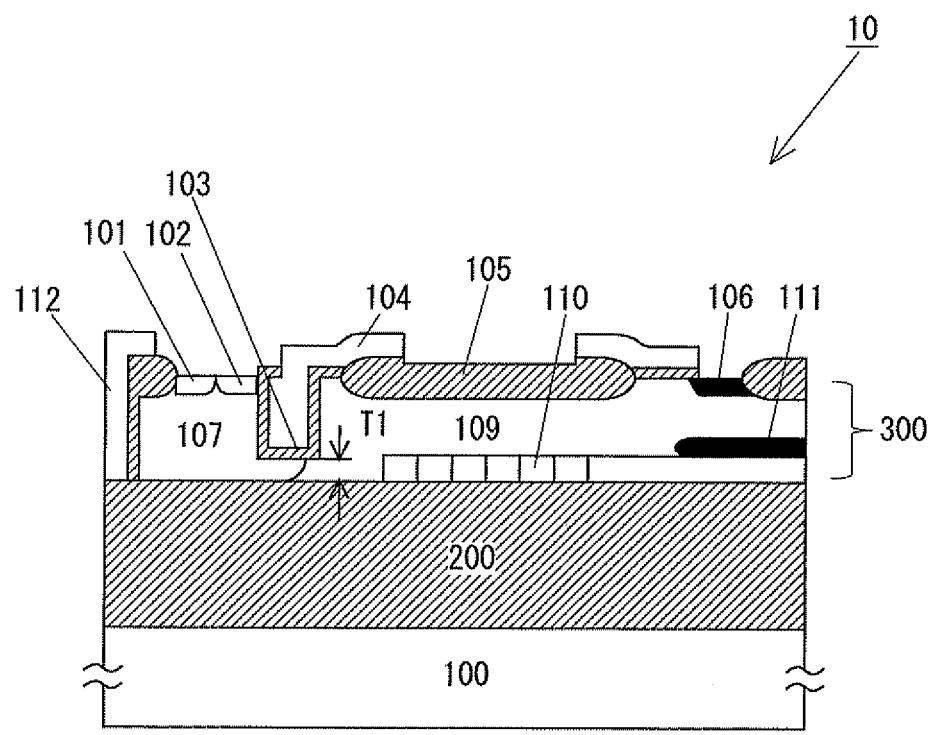
FIG. 1 is a cross-sectional view of an exemplary main portion of a structure of a lateral semiconductor device 10 according to a first embodiment.

FIG. 1 is a cross-sectional view of an exemplary main portion of a structure of the lateral semiconductor device 10 according to the first embodiment of the present invention. In FIG. 1, components necessary for describing the present embodiment are mainly indicated.

As shown in FIG. 1, the lateral semiconductor device 10 according to the first embodiment of the present invention is formed with the use of an SOI (Silicon on Insulator) substrate. Specifically, the lateral semiconductor device 10 according to the first embodiment of the present invention includes: a single crystalline silicon support substrate 100; a buried oxide layer 200 layered over the single crystalline silicon support substrate 100; and a semiconductor layer 300. A surface portion of the semiconductor layer 300 may be covered with an interlayer insulating layer, and a potential source line or the like may be disposed on the interlayer insulating layer, which is not shown.

The single crystalline silicon support substrate 100 is, for example, a layer containing a p-type impurity. Further, a resistivity of the single crystalline silicon support substrate 100 preferably indicates such a value as to maintain mechanical strength. For example, the resistivity preferably ranges from about 1 mΩ·cm to about 100 mΩ·cm. The single crystalline silicon substrate 100 is simply referred to as the support substrate 100 in the below description.

The buried oxide layer 200 is preferably formed with the use of a material, such as silicon oxide, having a relatively low dielectric constant, and the thickness thereof in the layering direction (vertical direction) preferably ranges from about 3.0 μm to about 5.0 μm.

The semiconductor layer 300 is a semiconductor layer that contains an n⁻ type impurity in a relatively low concentration, and layer regions having different characteristics are partially formed in the semiconductor layer 300. Specifically, as shown in FIG. 1, in the semiconductor layer 300, a contact body region (also referred to as a body P⁺ diffusion layer) 101, an emitter region (also referred to as an emitter N⁺ diffusion layer) 102, a main body region (also referred to as a body P diffusion layer) 107, a graded concentration diffusion layer 110, a buffer region (also referred to as a buffer N diffusion layer) 111, and the like are formed.

The main body region 107 is a layer region that contains a p-type impurity and is formed from the face of the semiconductor layer 300 to reach the back surface thereof.

The emitter region 102 is a region that contains an n⁺ type impurity in a higher concentration as compared to a main portion (n⁻ type region; an active layer N⁻ region 109) of the semiconductor layer 300. The emitter region 102 is formed in the main body region 107 on the face side of the semiconductor layer 300. The emitter region 102 is electrically connected to an emitter electrode that is one of main electrodes, which is not shown.

The contact body region 101 is a region that contains a p⁺ type impurity in a higher concentration as compared to the main body region 107. The contact body region 101 is formed in the main body region 107 on the face side of the semiconductor layer 300. The contact body region 101 has an ohmic connection to the emitter electrode, which is not shown.

The buffer region 111 is a layer region containing an n-type impurity in a high concentration.

A collector region (a collector P⁺ diffusion layer) 106 is a region that contains a p⁺ type impurity in a higher concentration as compared to the main body region 107. The collector region 106 is electrically connected to a collector electrode that is the other of the main electrodes, which is not shown.

The graded concentration diffusion layer 110 is a layer region that is formed in the semiconductor layer 300 in a boundary of the buried oxide layer 200. The graded concentration diffusion layer 110 is a region that contains an n-type impurity, and is formed, such that the concentration thereof is changed continuously or discontinuously over, for example, eight steps in the drift direction. More specifically, the concentration of the impurity in the graded concentration diffusion layer 110 increases from the emitter region 102 side toward the collector region 106 side.

The contact body region 101, the emitter region 102, the collector region 106, the main body region 107, the graded concentration diffusion layer 110, and the buffer region 111 as described above, are formed by a conventionally well-known method such as an ion implantation or the like.

A LOCOS (Local Oxidation of Silicon) oxide 105 is formed on or around the semiconductor layer 300 having been thus formed. Further, a gate oxide 103 and a poly gate electrode 104 are formed in the semiconductor layer 300 having been thus formed.

The LOCOS oxide 105 is, for example, an oxide film formed on the face portion of the drift region 109. A material of the LOCOS oxide 105 is, for example, silicon oxide.

The gate oxide 103 is an oxide layer that contacts with a portion of the drift region 109 and a portion of the main body region 107.

The lateral semiconductor device 10 according to the first embodiment of the present invention has a characteristic that, as shown in FIG. 1, a trench-type gate structure in which a trench does not reach the buried oxide layer 200 is formed in an interface between the main body region 107 and the drift region 109.

Figure 10:
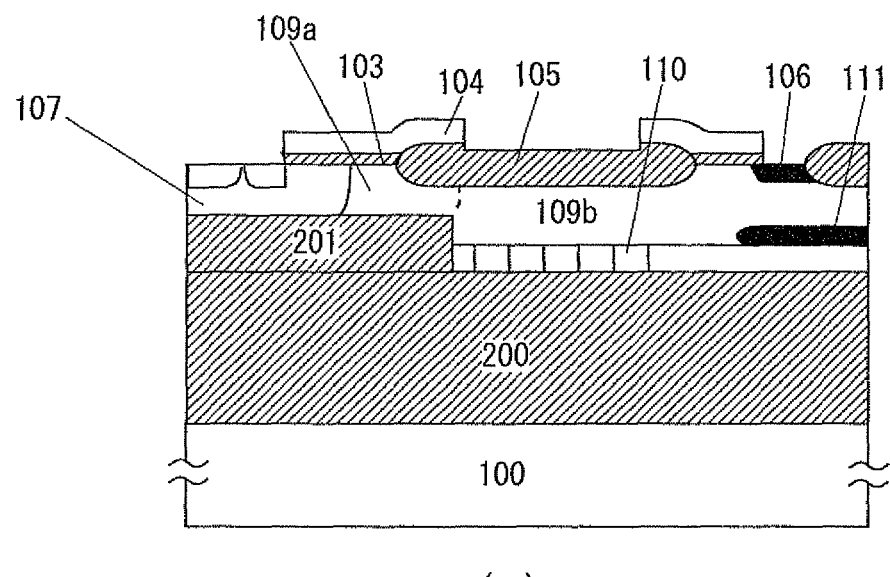
FIG. 10 is a cross-sectional view of an exemplary main portion of a structure of a conventional lateral semiconductor device.

In other words, in the lateral semiconductor device 10 according to the present embodiment, as shown in FIG. 1, a buried oxide layer is not formed under the main body region 107, namely, the carrier accumulation promoting BOX 201 (see FIG. 10) as formed in the lateral semiconductor device of Patent Literature 1 as described above is not formed. Therefore, a process of forming the carrier accumulation promoting BOX 201 is unnecessary, thereby simplifying a manufacturing method and reducing production cost (the manufacturing method will be described below in detail).

Specifically, the trench-type gate structure (hereinafter, simply referred to as a trench gate) is formed by the gate oxide 103 and the poly gate electrode 104 as shown in FIG. 1. Thus, a thickness T1 (that is, a thickness T1 of a gate portion active layer N⁻ as shown in FIG. 1) of the drift region 109 can be reduced. In other words, a route through which holes transfer from the drift region 109 to the main body region 107 is narrowed by the trench gate, and holes are accumulated, thereby reducing an on-resistance.

A characteristic of a trade-off between a turn-off switching time (tf) and a collector-emitter saturation voltage (VCEsat) is also improved, without reducing a collector breakdown voltage (BVCEO) between collector and emitter, as compared to a conventional lateral semiconductor device (the lateral semiconductor device of Patent Literature 1 described above).

Figure 2:
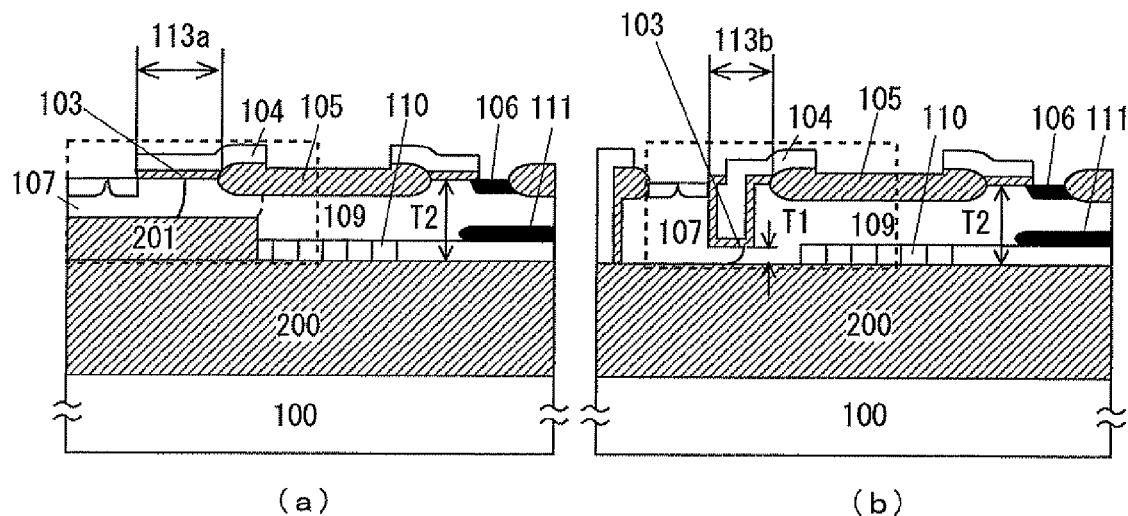
FIG. 2 is cross-sectional views of an exemplary main portion of the structure of the lateral semiconductor device 10, and an exemplary main portion of a structure of a conventional lateral semiconductor device.
Figure 3:
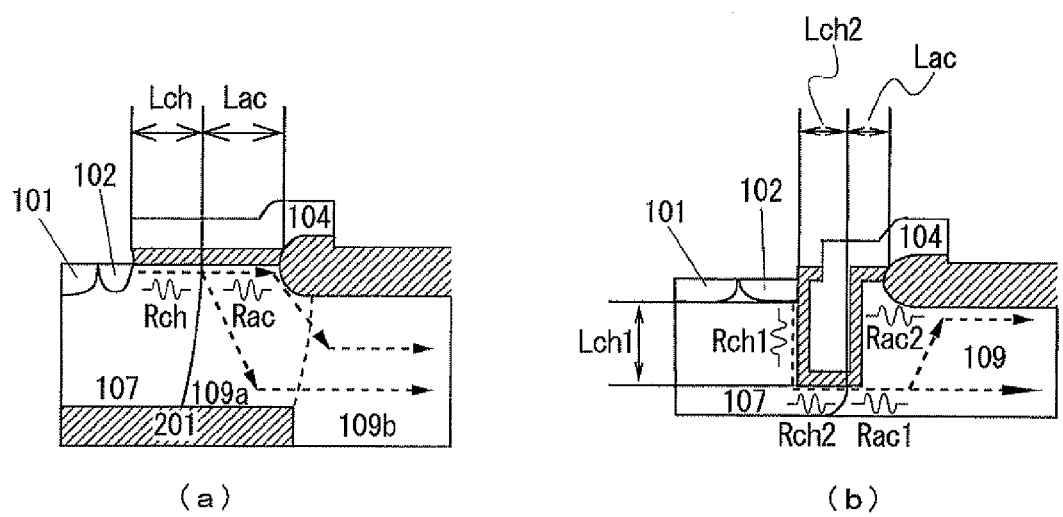
FIG. 3 is enlarged views of portions, in FIG. 2, enclosed by broken lines.

With reference to FIG. 2 and FIG. 3, a conventional lateral semiconductor device (specifically, the lateral semiconductor device of Patent Literature 1 as described above) and the lateral semiconductor device 10 according to the present embodiment are compared, and a flow of electron current in each of the lateral semiconductor devices will be described.

(a) of FIG. 2 is a cross-sectional view of an exemplary main portion of the structure of the conventional lateral semiconductor device, and (b) of FIG. 2 is a cross-sectional view of an exemplary main portion of the structure of the lateral semiconductor device 10 according to the first embodiment. For the description, FIG. 10 is indicated again as (a) of FIG. 2, and FIG. 1 is indicated again as (b) of FIG. 2.

Further, (a) and (b) of FIG. 3 are enlarged views of portions enclosed by broken lines in (a) and (b), respectively, of FIG. 2. For the below description, arrows are indicated in FIG. 3.

In general, when a gate-emitter voltage (VGE) is higher than a threshold voltage (VT), an n-type channel is formed in the interface between the gate oxide 103 and the main body region 107, to electrically connect between the emitter region 102 and the drift region 109, and electrons flow into the drift region 109. The electrons act as a base current of a pnp-type transistor that is formed by the main body region 107 (P-type), the drift region 109 and the buffer region 111 (n-type), and the collector region 106 (P-type), and the pnp transistor is turned on.

Since electrons are supplied from the emitter region 102 and holes are injected from the collector region 106, excessive electrons and holes are accumulated in the drift region 109 (a phenomenon called conductivity modulation).

In the conventional lateral semiconductor device, as shown in (a) of FIG. 2, particularly in (a) of FIG. 3, the carrier accumulation promoting BOX 201 is formed to reduce an area in which the main body region 107 and the drift region 109*a* contact with each other, and holes can be restrained from transferring from the drift region 109*a* to the main body region 107 without preventing holes from transferring from the drift region 109*b* to the drift region 109*a*. As a result, an increased number of holes are accumulated in the drift region 109*a*, to reduce a resistance in the drift region 109*a*.

On the other hand, in the lateral semiconductor device 10 according to the first embodiment of the present invention, as shown in (b) of FIG. 2, particularly in (b) of FIG. 3, a route through which holes transfer from the drift region 109 to the main body region 107 is narrowed (the thickness T1 of the gate portion active layer N⁻) by the trench gate, and holes are accumulated, thereby reducing a resistance in the region.

With reference to (a) and (b) of FIG. 3, a flow of electron current in each of the conventional lateral semiconductor device (the lateral semiconductor device of Patent Literature 1 as described above) and the lateral semiconductor device 10 according to the present embodiment, will be more specifically described.

Firstly, a flow of electron current in a region indicated by 113*a* in (a) of FIG. 2 will be described in the case of, for example, the conventional lateral semiconductor device shown in (a) of FIG. 2.

In the conventional lateral semiconductor device, when a positive electric potential is applied to the poly gate electrode 104, a channel is formed just below the gate oxide 103, and electron current flows from the drift layer region 109*a* to the drift layer region 109*b* as indicated by dashed arrows in (a) of FIG. 3.

At this time, when a width Lac is excessively small, a resistance Rac is increased. Therefore, in general, the width Lac is preferably in a range from about 1.0 μm to about 2.0 μm, and designing is performed in this range in general. In order to restrain a saturation current and improve resistance to short-circuiting, a width Lch is preferably in a range from about 1.5 μm to about 2.0 μm, and designing is performed in this range in general, and the width Lch cannot be extremely reduced. Therefore, the width 113*a* is approximately in a range from 2.5 μm to 4.0 μm (width 113*a*=width Lch+width Lac).

Next, a flow of electron current in a region indicated by 113*b* in (b) of FIG. 2 will be described for the lateral semiconductor device 10 according to the first embodiment of the present invention as shown in (b) of FIG. 3.

In the lateral semiconductor device 10 according to the first embodiment of the present invention, a flow of electron current is as indicated by dashed arrows in (b) of FIG. 3, and even when a width Lac is reduced, neither a resistance Rac1 nor a resistance Rac2 is increased. Thus, the width Lac can be in a range from about 0.2 μm to about 0.5 μm.

The width Lch as indicated in (a) of FIG. 3 can be represented as width Lch=width Lch1+width Lch2 in (b) of FIG. 3. Further, when the width Lch1 is about 1.0 μm, the width Lch2 is in a range from about 0.5 μm to about 1.0 μm. Therefore, the width 113*b* is approximately in a range from 0.7 μm to 1.5 μm (width 113*b* width Lch2+width Lac).

As described above, in the lateral semiconductor device 10 according to the first embodiment of the present invention, since the trench-type gate structure in which the trench does not reach the buried oxide layer 200 is formed in the interface between the main body region 107 and the drift region 109, the thickness T1 of the drift region 109 can be reduced (the thickness T1 of the gate portion active layer N⁻ in FIG. 1 and (b) of FIG. 2), and accumulation of holes in the vicinity of the thin portion is increased as compared to in the conventional lateral semiconductor devices. Therefore, a resistance can be greatly reduced in this region.

Further, as described above, since a cell pitch can be reduced (width 113*a*>width 113*b*) as compared to in the conventional lateral semiconductor devices, a characteristic of a trade-off between a turn-off switching time (tf) and a collector-emitter saturation voltage (VCEsat) can be improved without reducing a collector breakdown voltage (BVCEO).

Comparison in trade-off characteristic among the lateral semiconductor device 10 according to the first embodiment of the present invention, lateral semiconductor devices according to second and third embodiments as described below, and the conventional lateral semiconductor device, will be described below.

[Manufacturing Method]

Figure 4:
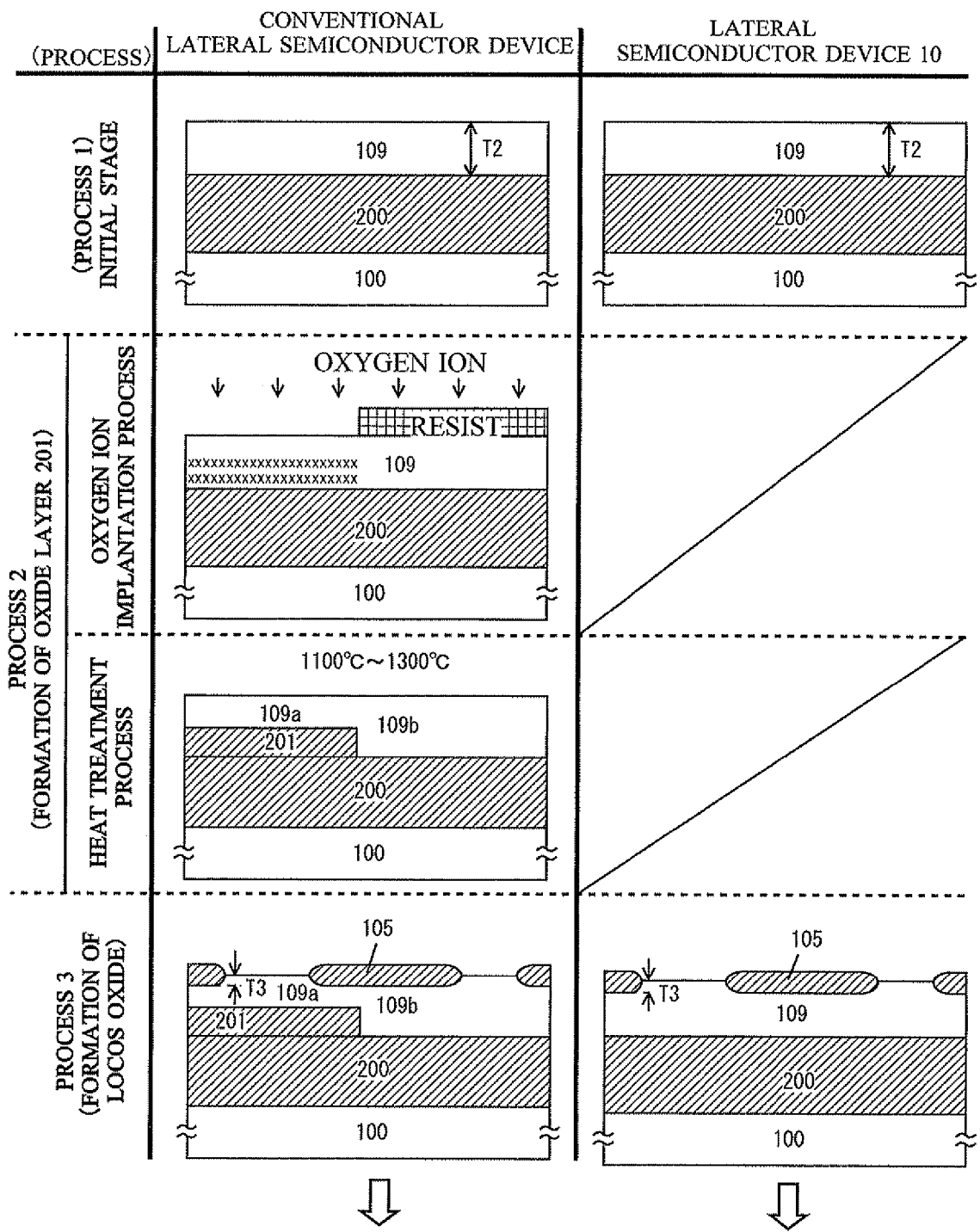
FIG. 4 illustrates an exemplary manufacturing process (process 1 to process 3) for manufacturing the lateral semiconductor device 10 according to the first embodiment.
Figure 5:
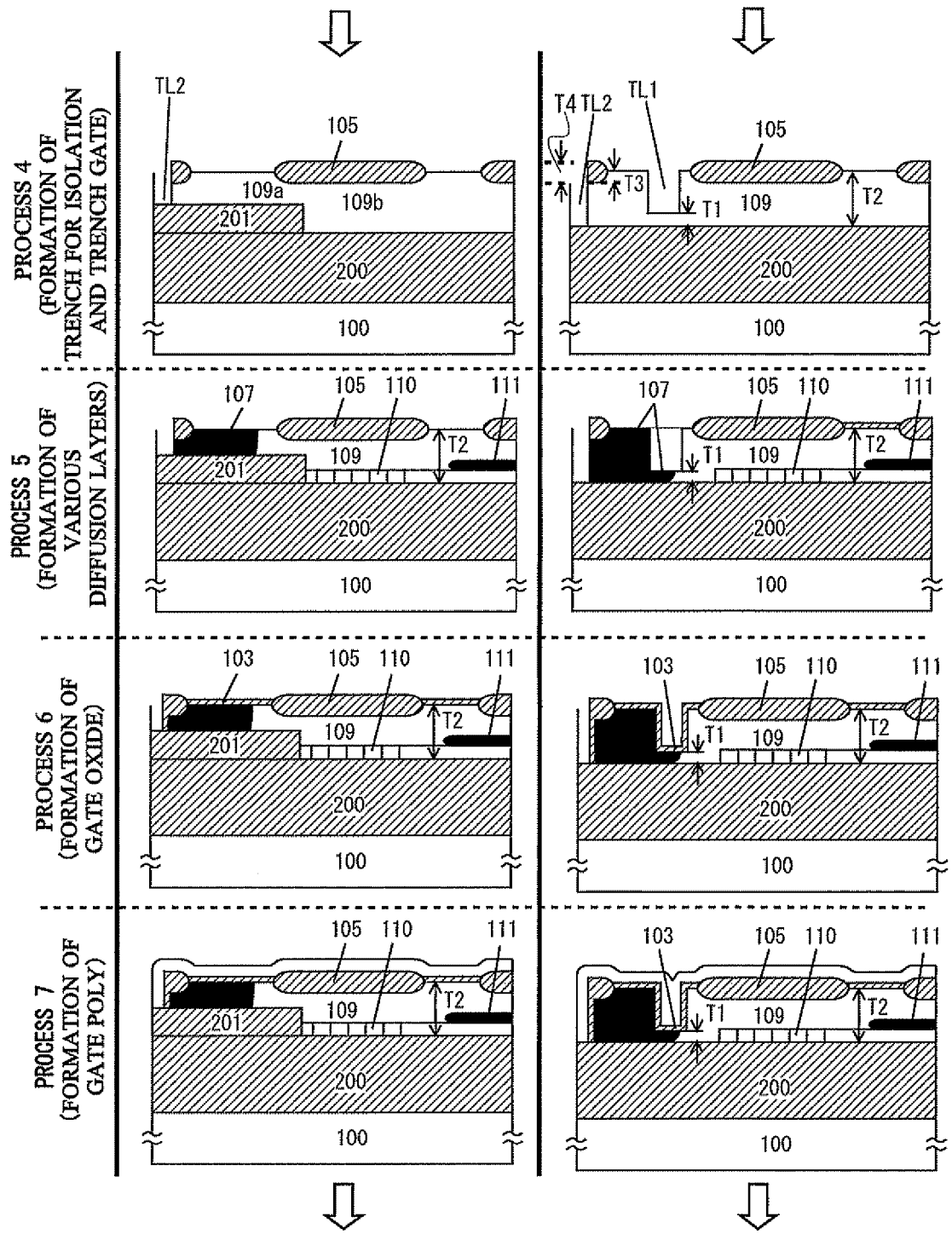
FIG. 5 illustrates an exemplary manufacturing process (process 4 to process 7) for manufacturing the lateral semiconductor device 10 according to the first embodiment.

Next, a manufacturing method for manufacturing the lateral semiconductor device 10 according to the first embodiment of the present invention will be described with reference to the drawings. FIG. 4 to FIG. 6 illustrate an exemplary manufacturing process for manufacturing the lateral semiconductor device 10 according to the first embodiment of the present invention.

In the following description, with reference to FIG. 4 to FIG. 6, an exemplary manufacturing process for manufacturing the lateral semiconductor device 10 according to the first embodiment of the present invention will be described together with an exemplary manufacturing process for manufacturing the conventional lateral semiconductor device (specifically, the lateral semiconductor device of Patent Literature 1 described above).

Further, in the following description, the lateral semiconductor device according to the first embodiment of the present invention is represented as the lateral semiconductor device 10 by using reference character, and what is simply referred to as a lateral semiconductor device represents the lateral semiconductor device according to the first embodiment of the present invention and the conventional lateral semiconductor device.

The manufacturing method for manufacturing the lateral semiconductor device 10 according to the first embodiment of the present invention has a characteristic that, as described above, a process of forming a buried oxide layer disposed under the main body region 107, that is the carrier accumulation promoting BOX 201 (see FIG. 10) as is formed in the conventional lateral semiconductor device, is unnecessary, and the trench-type gate structure in which the trench does not reach the buried oxide layer 200 is formed in the interface between the main body region 107 and the drift region 109. Hereinafter, the manufacturing method for manufacturing the lateral semiconductor device 10 according to the first embodiment of the invention will be described particularly according to the characteristic described above.

For the lateral semiconductor device, as indicated in process 1 in FIG. 4, firstly, an SOI (Silicon On Insulator) wafer is used. The support substrate 100 contains, for example, a p-type impurity. Further, a resistivity of the support substrate 100 preferably indicates such a value as to maintain mechanical strength. For example, the resistivity preferably ranges from about 1 mΩ·cm to about 100 mΩ·cm. The buried oxide layer 200 is preferably formed with the use of a material, such as silicon oxide, having a relatively low dielectric constant. The thickness thereof in the layering direction (vertical direction) ranges from about 3.0 μm to about 5.0 μm in the case of a withstand voltage being about 700V, and ranges from about 10 μm to about 15 μm in the case of a withstand voltage being about 2000V. A thickness T2 of the drift region 109 is about 2.0 μm, and a concentration of an impurity (phosphorus) to be injected is about 1e15 cm$^{-3}$.

Next, process 2 in FIG. 4 will be described. However, as described above, in the manufacturing method for manufacturing the lateral semiconductor device 10, process 2 need not be performed. Namely, to be specific, process 2 is a process of forming the carrier accumulation promoting BOX 201 (see FIG. 10).

Process 2 in FIG. 4 will be specifically described. For example, in a case where a SIMOX (Separation by IMplanted Oxygen) method is applied, a resist is firstly applied to the surface of the drift region 109, and ions of oxygen (O$_2$) are implanted with a high energy (an oxygen ion implantation process of process 2 in FIG. 4). Thereafter, for example, heat treatment at about 1100° C. to about 1300° C. is performed by using a thermal oxidation device, to obtain the carrier accumulation promoting BOX 201 (a heat treatment process of process 2 in FIG. 4).

Next, the process is advanced to process 3, and, for example, a layer of silicon oxide, that is, the LOCOS oxide 105 is formed on the surface portion of the drift region 109. A depth T3 of the LOCOS oxide 105 from the surface portion of the drift region 109 to an inner portion of the drift region 109 preferably ranges from about 0.3 μm to about 0.5 μm.

The process is advanced to process 4 in FIG. 5. For the lateral semiconductor device 10, a trench TL1 for a gate electrode is formed from the surface of the drift region 109 toward the buried oxide layer 200 so as not to reach the buried oxide layer 200, and a trench TL2 for a device-isolating electrode is formed so as to pass through the LOCOS oxide 105 and reach the buried oxide layer 200.

The process 4 will be specifically described. More specifically, in process 4 in FIG. 5, process 4-1 and process 4-2 are performed as described below.

As shown in FIG. 5, an Si/SiO$_2$ interface in a region in which the LOCOS oxide 105 is formed is located so as to be deeper than the surface of an active region (the drift region 109) by the depth T3.

Firstly, an etching process is performed on the LOCOS oxide 105. More specifically, the LOCOS oxide 105 is etched such that a depth from the surface of the drift region 109 is the depth T3. In other words, as indicated in process 4 in FIG. 5, the LOCOS oxide 105 is etched by a depth T4 from the surface of the LOCOS oxide 105 toward the oxide layer 200. This process is referred to as process 4-1, which is not indicated in the drawings.

A resist is applied to the surface of the drift region 109, and exposure to light and development are performed on the resist at predetermined pitches, to form openings on the resist, and the trench TL1 and the trench TL2 are then formed toward the buried oxide layer 200 by dry etching or the like. The forming of the trench TL1 and the forming of the trench TL2 are simultaneously started, and an engraving speed (an engraving rate, an etching rate) are the same therebetween. Namely, the trench TL1 is formed by, for example, etching from the surface of the drift region 109 toward the buried oxide layer 200 being performed, and the trench TL2 is formed by, for example, etching from a position (the portion obtained by the etching of process 4-1) that is deeper than the surface of the drift region 109 by the depth T3, toward the buried oxide layer 200, being performed.

Thereafter, at a time when the trench TL2 reaches the buried oxide layer 200, the etching for forming the trench TL1 and the etching for forming of the trench TL2 as described above, are ended. This process is referred to as process 4-2, which is not indicated in the drawings.

Namely, in a case where the thickness T1 and the depth T3 are equivalent to each other, the LOCOS oxide 105 is etched, and thereafter the etching for forming the trench TL1 and the etching for forming the trench TL2 are simultaneously started so as to be performed at the same rate. In this case, at a time when the trench TL2 reaches the buried oxide layer 200, the forming of the trench TL1 and the forming of the trench TL2 are stopped. Thus, at a time when the trench TL2 reaches the buried oxide layer 200, the trench TL1 is formed so as not to reach the buried oxide layer 200 (so as to obtain the thickness T1 of the gate portion active layer N). Thus, the trench TL1 and the trench TL2 can be simultaneously formed.

Process 4-1 described above corresponds to an example of an etching process the claim recitation. Process 4-2 described above corresponds to an example of a trench forming process the claim recitation.

Next, in process 5, various diffusion layers (the graded concentration diffusion layer 110, the buffer region 111) are formed by a typical ion implantation method. A concentration of an impurity in the graded concentration diffusion layer 110 is distributed into, for example, eight steps of concentrations.

Next, in process 6, the gate oxide 103 is formed specifically by a thermal oxidation process or the like, for example. Further, in process 6, not only side walls of the trench TL1 for the gate electrode but also side walls of the trench TL2 for the device-isolating electrode are oxidized. The thickness of an oxide layer of the side walls of the trench TL2 for the device-isolating electrode is equal to the thickness of an oxide layer of the side walls of the trench TL1 for the gate electrode. Therefore, plural trenches could be enough to meet a demand for high voltage isolation. However, in the lateral semiconductor device 10, the trench TL2 for the device-isolating electrode is formed in the main body region 107 that keeps low potential. Therefore, one trench is sufficient.

Next, in process 7, for example, Si single crystals that have a good filling characteristic of filling the trenches TL1 and TL2 by a CVD (Chemical Vapor Deposition) method or the like, are deposited and grown in each of the trenches. Thus, the trenches are simultaneously filled with Si single crystals.

The process is advanced to process 8 in FIG. 6. Patterning is performed on the Si single crystals deposited in process 7, and etching is then performed thereon. Thus, the poly gate electrode 104 and a poly trench electrode 112 are formed.

In process 9, the contact body region 101, the emitter region (emitter N$^+$ diffusion layer) 102, and the collector region (collector P$^+$ diffusion layer) 106 are formed by ion implantation.

After process 9 described above, an interconnection process and the like are performed, which is not described, and the lateral semiconductor device 10 according to the first embodiment is manufactured.

Thus, for the lateral semiconductor device 10, the process of forming the carrier accumulation promoting BOX 201 as is performed for manufacturing the conventional lateral semiconductor devices, is unnecessary, and therefore the lateral semiconductor device 10 can be manufactured in a simplified method, and production cost can be reduced.

Specifically, in the conventional lateral semiconductor devices, the buried oxide layer 200 disposed under the P-type body layer 107 among the P-type body layer 107 and the N-type drift layers 109a and 109b has a thickness (the carrier accumulation promoting BOX 201) that is greater than a remaining region of the buried oxide layer 200 disposed under the N-type drift layers 109a and 109b. Thus, fewer holes drift through from the N-type drift layer region 109a to the P-type body layer 107 to reduce an on-resistance, as compared to the N-type drift layer region 109b (see FIG. 10).

On the other hand, in the lateral semiconductor device 10, a route through which holes transfer from the drift region 109 to the main body region 107 is narrowed due to the trench TL1, and holes are accumulated, thereby reducing an on-resistance (see FIG. 1).

Namely, for the lateral semiconductor devices, a cost for a process of forming the trench is lower than a cost for a process of forming the carrier accumulation promoting BOX 201. For manufacturing the lateral semiconductor device 10 according to the present embodiment, a process of forming the carrier accumulation promoting BOX 201 need not be performed, and production cost can be thus reduced, and an on-resistance can be reduced in a simplified method as compared to the conventional lateral semiconductor devices.

Second Embodiment

Next, a lateral semiconductor device 20 according to a second embodiment of the present invention will be described.

For the lateral semiconductor device 20 according to the second embodiment, only a difference from the lateral semiconductor device 10 according to the first embodiment as described above will be described below.

FIG. 7 is a cross-sectional view of an exemplary main portion of a structure of the lateral semiconductor device 20 according to the second embodiment.

As shown in FIG. 7, the lateral semiconductor device 20 according to the second embodiment is different from the lateral semiconductor device 10 according to the first embodiment as described above in that an emitter region (also referred to as an emitter $N^+$ diffusion layer) 102 is formed toward the buried oxide layer 200 so as to be deeper in the lateral semiconductor device 20 than in the lateral semiconductor device 10. More specifically, a distance from the surface of the buried oxide layer 200 to the emitter region 102 is less than a distance (the thickness T1) from the bottom of the trench TL1 to the buried oxide layer 200.

Thus, in the lateral semiconductor device 20 according to the second embodiment, a channel which has only the Lch2 shown in FIG. 3 can be formed, and a channel length can be shortened as compared to that in the lateral semiconductor device 10 according to the first embodiment as described above. As a result, electron currents flowing into the drift region 109 can be increased as compared to in the lateral semiconductor device 10 according to the first embodiment, and a trade-off characteristic can be improved as compared to in the lateral semiconductor device 10 according to the first embodiment as well as the conventional lateral semiconductor devices (the details will be described below).

The emitter region 102 as described above can be obtained by, for example, patterning for the emitter region 102 in process 9 in the manufacturing method for manufacturing the lateral semiconductor device 10 according to the first embodiment as shown in FIG. 6, being changed (so as to cross the emitter region 102 and the trench TL1).

Third Embodiment

Next, a lateral semiconductor device 30 according to a third embodiment of the present invention will be described.

Also for the lateral semiconductor device 30 according to the third embodiment, only a difference from the lateral semiconductor device 10 according to the first embodiment as described above will be described below.

Figure 8:
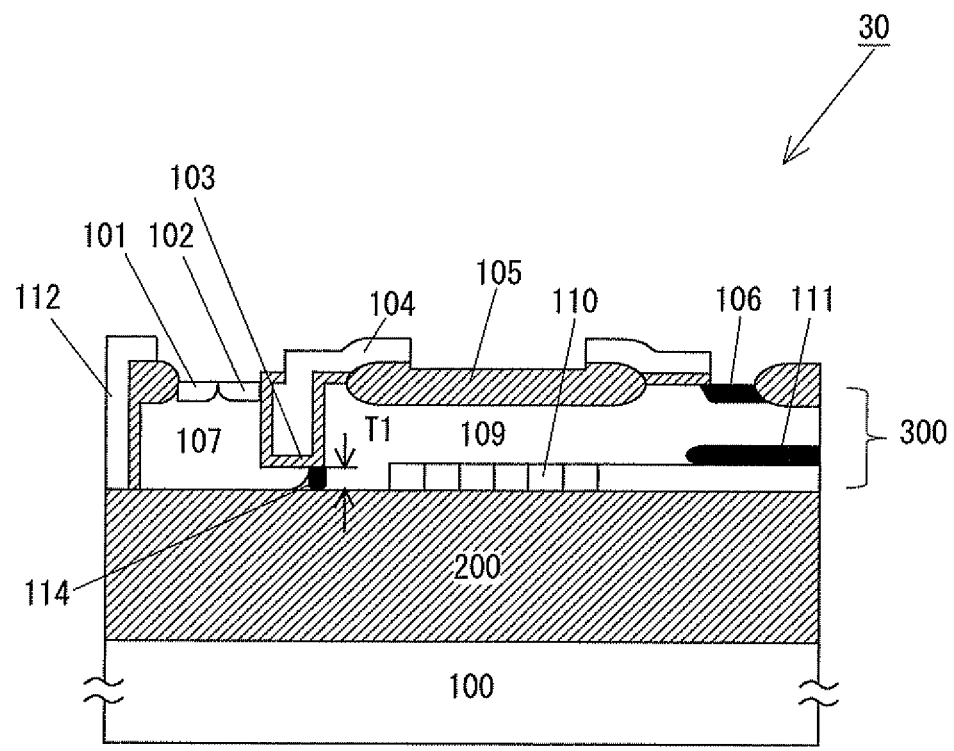
FIG. 8 is a cross-sectional view of an exemplary main portion of a structure of a lateral semiconductor device 30 according to a third embodiment.

FIG. 8 is a cross-sectional view of an exemplary main portion of a structure of the lateral semiconductor device 30 according to the third embodiment.

As shown in FIG. 8, the lateral semiconductor device 30 according to the third embodiment is different from the lateral semiconductor device 10 according to the first embodiment as described above in that the lateral semiconductor device 30 includes a carrier accumulation layer region (N-layer for storing carriers) 114 in addition to the components of the lateral semiconductor device 10 according to the first embodiment.

Thus, holes are less likely to transfer from the drift region 109 to the main body region 107 as compared to in the lateral semiconductor device 10 according to the first embodiment, thereby improving carrier storing effect. As a result, the trade-off characteristic can be further improved as compared to in the lateral semiconductor device 20 according to the second embodiment as described above (the details will be described below).

Further, in order to form the carrier accumulation layer region 114 as described above, for example, ion implantation for forming the carrier accumulation layer region 114 may be performed in process 5 in the manufacturing method for manufacturing the lateral semiconductor device 10 according to the first embodiment as shown in FIG. 5. In a case where the carrier accumulation layer region 114 is formed, a concentration of an impurity in the carrier accumulation layer region 114 is preferably high, and the width of the carrier accumulation layer region 114 is preferably great. Specifically, for example, in a case where a breakdown voltage needs to be about 700V, the width is preferably about 1.0 μm, and a concentration of an impurity therein preferably ranges from about $1$ $cm^{-3}$ to about $3e17$ $cm^{-3}$.

Next, comparison among trade-off characteristics of the lateral semiconductor devices according to the first to the third embodiments as described above, and a conventional lateral semiconductor device, is performed with reference to FIG. 9.

FIG. 9 illustrates collector-emitter saturation voltage (VCEsat)—turn-off switching time (tf) characteristics in the lateral semiconductor devices according to the respective embodiments and a conventional lateral semiconductor device. In FIG. 9, the horizontal axis represents VCEsat in arbitrary units (A.U), and the vertical axis represents tf in arbitrary units. Trade-off characteristics of the lateral semiconductor devices according to the respective embodiments are indicated by solid lines, and a trade-off characteristic of the conventional lateral semiconductor device is indicated by a broken line.

Firstly, as shown in FIG. 9, it can be found that the characteristic of the trade-off between tf and VCEsat is greatly improved in the lateral semiconductor device 10 according to the first embodiment as compared to the conventional lateral semiconductor device. Further, it can be found that the characteristic of the trade-off between tf and VCEsat is improved in the lateral semiconductor device 20 according to the second embodiment as compared to the lateral semiconductor device 10 according to the first embodiment. Moreover, it can be found that the characteristic of the trade-off between tf and VCEsat is improved in the lateral semiconductor device 30 according to the third embodiment as compared to the lateral semiconductor device 20 according to the second embodiment.

The manner described above in the embodiments is merely illustrative, and the technical scope of the present invention is not limited thereto. Therefore, any structure can be adopted within a scope in which the effects of the present invention are obtained.

INDUSTRIAL APPLICABILITY

The lateral semiconductor device and the manufacturing method for the same according to the present invention can be used as, for example, a lateral insulated gate bipolar transistor that can increase reduction of an on-resistance in a simplified method.

DESCRIPTION OF THE REFERENCE CHARACTERS

10 . . . lateral semiconductor device according to the first embodiment
20 . . . lateral semiconductor device according to the second embodiment
30 . . . lateral semiconductor device according to the third embodiment
100 . . . single crystalline silicon support substrate
101 . . . contact body region (body P$^+$ diffusion layer)
102 . . . emitter region (emitter N$^+$ diffusion layer)
103 . . . gate oxide
104 . . . poly gate electrode
105 . . . LOCOS oxide
106 . . . collector region (collector P$^+$ diffusion layer)
107 . . . main body region (body P$^+$ diffusion layer)
109 . . . N-type drift layer
109a . . . N-type drift layer region 1
109b . . . N-type drift layer region 2
110 . . . graded concentration diffusion layer
111 . . . buffer region (buffer N diffusion layer)
112 . . . poly trench electrode
200 . . . buried oxide layer
300 . . . single crystalline semiconductor layer

The invention claimed is:

1. A manufacturing method for manufacturing a lateral semiconductor device having an SOI (Silicon on Insulator) substrate, the lateral semiconductor device comprising a semiconductor layer that includes a buried oxide layer and a drift region, the manufacturing method comprising:
forming a first trench by etching a portion of a LOCOS oxide, the LOCOS oxide having been formed at a surface portion of the drift region, a portion of the LOCOS oxide extending in a thickness direction to a predetermined depth beneath the surface of the drift region, the first trench extending from a surface of the LOCOS oxide through the entire thickness of the LOCOS oxide to reach a position corresponding to the predetermined depth beneath the surface of the drift region, and then
simultaneously forming a second trench extending from a portion of the surface of the drift region not covered by LOCOS oxide toward the buried oxide layer by etching, while extending the first trench by continuing etching of the first trench toward the buried oxide layer, at a same etching rate, and stopping forming the first trench and the second trench at a time when the first trench reaches the buried oxide layer.

* * * * *